(12) United States Patent
Peretti et al.

(10) Patent No.: US 11,742,569 B2
(45) Date of Patent: Aug. 29, 2023

(54) PROTECTIVE ENCLOSURE SYSTEM

(71) Applicant: The Dragon Group, LLC, Rathdrum, ID (US)

(72) Inventors: Todd J Peretti, Hayden, ID (US); Adrian W Zettell, Hayden, ID (US)

( * ) Notice: Subject to any disclaimer, the term of this patent is extended or adjusted under 35 U.S.C. 154(b) by 67 days.

(21) Appl. No.: 17/410,855

(22) Filed: Aug. 24, 2021

(65) Prior Publication Data
US 2022/0069457 A1    Mar. 3, 2022

Related U.S. Application Data

(60) Provisional application No. 63/069,966, filed on Aug. 25, 2020.

(51) Int. Cl.
| | |
|---|---|
| *H01Q 1/40* | (2006.01) |
| *H05K 5/03* | (2006.01) |
| *H01Q 1/24* | (2006.01) |
| *H05K 5/02* | (2006.01) |

(52) U.S. Cl.
CPC ............... *H01Q 1/40* (2013.01); *H01Q 1/241* (2013.01); *H05K 5/03* (2013.01); *H05K 5/0204* (2013.01)

(58) Field of Classification Search
CPC ............ H01Q 1/40; H01Q 1/42; H01Q 1/422; H01Q 1/44; H01Q 1/241; H05K 5/03; H05K 5/0204
See application file for complete search history.

(56) References Cited

U.S. PATENT DOCUMENTS

| | | | | |
|---|---|---|---|---|
| 2007/0042170 A1* | 2/2007 | Morin | ...................... | H01B 3/48 428/221 |
| 2011/0134015 A1* | 6/2011 | Yang | ...................... | H01Q 1/243 343/878 |
| 2013/0109435 A1* | 5/2013 | McGaughey | ............ | H01Q 7/00 455/575.8 |

* cited by examiner

*Primary Examiner* — Thai Pham
(74) *Attorney, Agent, or Firm* — Chang and Hale LLP

(57) ABSTRACT

Representative implementations of devices and techniques provide an exemplary protective enclosure system that includes a cover having a protective cavity. The cover includes a substrate layer and protective layer, with the protective layer comprising a radio-frequency-transparent polyurea. The cover is lightweight and can be installed with minimal manpower and equipment.

22 Claims, 7 Drawing Sheets

PROTECTIVE ENCLOSURE SYSTEM

PRIORITY CLAIM AND CROSS-REFERENCE TO RELATED APPLICATION

This application claims the benefit under 35 U.S.C. § 119(e)(1) of U.S. Provisional Application No. 63/069,966, filed Aug. 25, 2020, which is hereby incorporated by reference in its entirety.

BACKGROUND

Protective enclosures or structures are installed in various locations around the world, in different types of environments. Protective enclosures or structures protect sensitive equipment deployed at the various locations within those environments from often harsh elements. The protective enclosures or structures must withstand the elements for at least the lifetime of the sensitive equipment, providing protection to the equipment over that time as well as allowing for its optimal performance.

For instance, mobile wireless communication network components, such as antennas and their associated electronic equipment are installed in a variety of outdoor environments, to provide adequate network coverage throughout a given region. These components are generally located so as to be the most effective, which often exposes them to the hazards of the elements. Protective enclosures or structures may be used to shield the antennas and associated components from the effects of the weather. Such structures, however, may interfere with the propagation of wireless signals and thus impede the performance of the wireless network components. For instance, materials used to protect an antenna may attenuate the signal transmitted or received by the antenna, depending on the materials.

Further, the protective enclosures commonly used are often very heavy, due to the types of materials used (e.g., metals, fiberglass, plastics, etc.). The weight of the protective enclosure is added to the weight of the communications equipment when the system is installed, often creating an undesirable loading on existing structures such as poles, buildings, towers, and so forth. New structures such as towers require heavier materials and build standards to support the weight of the equipment and enclosures. Large heavy-duty installation vehicles and equipment are needed to transport and install the systems, with additional manpower needed to operate the installation equipment and to handle the heavy components. These and other factors lead to increased cost of equipment and installation. Time needed for the installation may be increased as well, due to complexity and availability of equipment and manpower.

SUMMARY

This Summary is provided to introduce a selection of concepts in a simplified form that are further described below in the Detailed Description. This Summary is not intended to identify key features or essential features of the claimed subject matter, nor is it intended to be used as an aid in isolation to determine the scope of the claimed subject matter. Embodiments of the invention are defined by the claims below.

In brief and at a high level this disclosure describes, among other things, a protective enclosure system comprising a cover that forms a protective cavity. The walls, top, sides, and/or bottom, etc. of the cover are comprised at least of two layers: a substrate layer and a protective layer. In various embodiments, the substrate layer has a predetermined thickness and a predetermined density. The substrate layer has an outer surface and an inner surface that defines the protective cavity, and is transparent to radio frequencies from 0 GHz to over 25 GHz at the predetermined thickness and the predetermined density.

The protective layer envelopes or surrounds the substrate layer, and comprises a radio-frequency-transparent polyurea that is transparent to radio frequencies from 0 GHz to over 25 GHz. In the various embodiments, the protective enclosure system also includes an equipment-mounting component positioned within the protective cavity, configured to mount an item to be protected such that the item is fully enclosed by the cover. The equipment-mounting component may also be made from one or both of the materials of the substrate layer and the protective layer.

In various embodiments, the substrate layer comprises a light-weight foam material (such as polyisocyanurate, for example) that has a density of between 1 to 10 pounds per cubic foot when used on the cover. The protective layer can comprise a polyurea material capable of being sprayed while in a liquid state and curing to a solid state. The protective layer adheres to the outer surface of the substrate layer. The protective layer may be sprayed or otherwise coated onto the outer surface of the substrate layer after the substrate layer is formed. Alternately, the protective layer may be applied to the inside surface of a mold, and the substrate layer deposited into the mold afterwards, such that the protective layer is adhered to the outer surface of the substrate layer once cured.

The substrate layer of the cover may have a unitary construction or may be comprised of multiple portions or panels that are assembled together to form the cover. In an alternate embodiment, the thickness of the substrate layer is non-uniform over the substrate layer. For instance, the substrate layer may be thicker at a top portion or a bottom portion than at a side portion of the substrate layer (or vice versa). The panels (if applicable) may have a first thickness and the top and bottom portions of the cover may have a different second thickness. In other words, the panels may be uniform or non-uniform in thickness.

In various embodiments, at least the substrate layer is injection molded, allowing the substrate layer to take on various shapes and physical dimensions. For instance, in an implementation, the protective enclosure system, and particularly the cover is shaped and configured to enclose and to secure a 5G mobile network communications antenna within the protective cavity. Additional antenna mounting components may also be comprised of multiple layers (e.g., the substrate and the protective layer of polyurea), including sleeves, bases, poles, equipment cabinets, and the like. The additional antenna mounting components may be integral to or coupled to the protective enclosure cover, to form embodiments of the protective enclosure system. Hardware and connection components may be molded into the substrate layer of the antenna mounting components in some instances.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure. Shapes and/or dimensions shown in the illustrations of the figures are for example, and other shapes and or dimensions may be used and remain within the scope of the disclosure, unless specified otherwise.

DETAILED DESCRIPTION

Overview

Figure 1A:
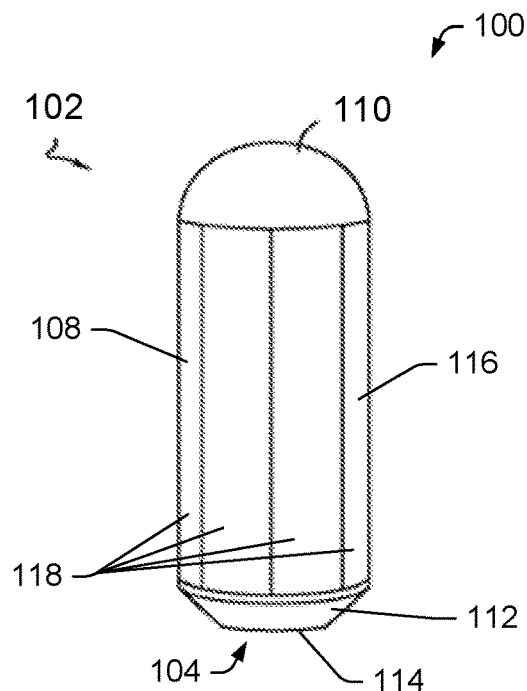
FIG. 1A is a perspective view of an example protective enclosure, according to an embodiment.

Conventionally, the infrastructure required to deploy mobile wireless communication network components such as antennas is heavy and expensive. For example, antennas are often installed on top of metal poles or structures that are 12 to 40 feet tall (or more). The antenna components are contained within a protective housing, which is often made of plastic and/or fiberglass that is transparent to a desired wave length. The protective housing protects the antenna and related components from environmental elements, and includes heavy mounting hardware for supporting and positioning the antenna within the housing.

Due to the weight of conventional antennas, protective housings, and mounting hardware, if the assembly is to be mounted on an existing pole, such as a streetlight pole, a telephone pole, or a traffic signal pole, then a load analysis may be required to ensure the existing pole can support the additional load. If a new pole is required, either because there is no existing pole in the desired location or because the existing pole cannot support the additional load, then the new pole must be installed, which may require multiple crews and heavy machinery. This cost can be significant, particularly in the context of networks that require high antenna density (and thus many antenna installations), such as 5G networks.

In addition to the weight and expense of installation, conventional materials used for protective housings have drawbacks in terms of longevity, weather resistance, and transparency. For example, as conventional plastics age and oxidize under exposure to the sun and other elements, transparency to desired wave lengths diminishes. Plastics may also crack with age and exposure and may thus require regular maintenance and/or replacement. Additionally, certain materials may be transparent to lower frequencies, but can be less transparent to higher frequencies (such as 1-60 GHz, for example), which can limit their applicability to communications networks that operate at higher frequencies, such as 5G networks.

In many cases it is also desirable for the protective enclosures or structures to be aesthetically pleasing, rather than having a negative impact on the scenery. The addition of traditional mobile communications antenna installations, with metallic, plastic, or fiberglass structures, is often objected to by community members because of their negative aesthetic.

Representative implementations of devices and techniques provide a lighter and less expensive protective enclosure system (which may be applied as an antenna mounting and protection system), as compared to conventional solutions, with improved weather resistance and longevity. Exemplary embodiments of the disclosed protective enclosure system 100 are constructed from a substrate layer 106 covered with a protective layer 108. The disclosed protective enclosure system 100 is transparent to radio frequencies, including those used for 5G mobile communications networks, making them ideal for such applications. The form-factor of the disclosed protective enclosure system 100 is customizable for creating a more pleasing aesthetic and for camouflage or integration with an existing design or environmental scheme, including shape, features and textures, and mounting options.

While the drawings and description show and discuss a mobile communications antenna system as an application of an exemplary protective enclosure system 100, this is not intended to be limiting. The enclosure system 100 and cover 102, with any or all of the related components discussed herein may be applied to any other component or system desired to be protected. In various embodiments, the cover 120 and any of the other components of the system 100 may have varying shapes, sizes, textures, and so forth, and remain within the scope of the disclosure.

The substrate layer 106 is a lightweight material, such as foam, which can take any desired shape, and the protective layer 108 is a radio-frequency-transparent polymer, such as a radio-frequency-transparent polyurea. The particular wavelength of radio frequency (RF) energy to which the substrate layer 106 and the protective layer 108 should be transparent is dependent on the intended application. For example, radio, radar, LIDAR, 4G, and 5G communication systems operate at a variety of wavelengths, and the substrate layer 106 and the protective layer 108 materials are selected to accommodate these relevant wavelengths. The thickness and the density of the substrate layer 106 and/or the protective layer 108 is also determined based on the need to be radio-transparent. Accordingly, the thickness and the density of the protective layer 108 and the substrate layer 106 in particular can vary for the individual components of a protective enclosure system 100.

The cover 102 that includes a lightweight substrate layer 106 and a protective layer 108 of radio-frequency-transparent polyurea, as described herein, provides a number of advantages over conventional equipment covers. First, it is significantly lighter and less expensive than conventional solutions. This means it can be installed with minimal manpower and equipment, and it also means that it can be installed on existing infrastructure with minimal impact and without the need for extensive load analysis. Second, such cover 102 offers enhanced transparency. For example, many materials exhibit a falloff in transparency as frequency increases. By contrast, certain polyureas, such as the products mentioned below sold by Specialty Products, Inc. and The Dragon Group, LLL, do not exhibit such falloff. Additionally, as noted above, as plastic ages and oxidizes over time and with exposure to the elements, its transparency diminishes. By contrast, certain polyureas, such as the below-mentioned products sold by Specialty Products, Inc. and The Dragon Group, LLL, maintain clarity under such conditions and provide excellent durability, weather resistance, and longevity.

Third, such a cover 102 can be manufactured to look like anything. Specifically, the substrate layer 106 may be molded or otherwise shaped to look like anything, and the protective layer 108 can be applied, such as by spraying, in a manner that maintains such shape. Thus, the shape, texture, and color of the cover 102 can be customized to camouflage the cover 102 (and thus an antenna and/or any related components therein) against any background.

The ability to blend antennas into existing surroundings is especially beneficial in networks that require high antenna density, such as 5G networks, because the requisite number of antennas may be installed while minimizing their visual impact. For example, covers 102 described herein may blend into architectural features (e.g., buildings, statues, fountains), natural features (e.g., rocks, trees, shrubs), or any other aspect of the environment. This may make it easier to obtain public and/or governmental approval for a high density of antenna installations, because the antennas will be largely unnoticeable.

An example protective enclosure system 100 applied as an antenna-mounting system may include a protective cover 102, antenna-mounting hardware, a base 702 (e.g., pole), and/or a control cabinet 206. An equipment-mounting component 304 may be positioned in the cover 102 for purposes of supporting and positioning antenna equipment inside the cover 102. Conventional mounting hardware is heavy metal. By reducing the weight and size of the mounting hardware, the weight and size of the cover 102, as well as the entire antenna and cover 102 assembly, may be reduced. This is also advantageous for minimizing the visual impact of antennas, as discussed above.

Aspects hereof also provide for bases 702, such as poles 204, for supporting antenna covers 102 and everything housed therein (e.g., the antenna, the equipment-mounting component 304). A pole 204 is one example of a base 702, but it will be understood that a base 702 can take any shape and need not resemble a pole. An exemplary base 702 is constructed of an ultra-high-density foam, such as a foam having a density of approximately 54 pounds per cubic foot or more. An ultra-high-density foam may be manufactured by pulling carbon-dioxide-producing elements out of the foam, thus preventing it from creating an interior cell structure and/or pockets of gas. Such foam does not expand and is comparable to a resin, in some aspects. It maintains strength, stiffness, and flexural strength that is advantageous for bases that support wireless network components, such as an antenna-and-cover assembly described herein. Yet it is also lightweight, which means that it can easily be installed with minimal manpower and equipment. For example, two workers in a pickup truck could install a pole 204 of this nature, in contrast to conventional metal poles, which require multiple crews and heavy machinery. The base 702 could be a standalone pole 204, an extension to an existing pole, a pole 204 that extends horizontally from a building, or any number of other configurations. Such pole 204 may have varying diameters, and it may range in length to more than 32 feet.

Additionally, by constructing a base 702 from foam, as opposed to conventional metal bases, the base 702 can take any form desired. It can be molded or otherwise shaped to be any shape, size, texture, or the like. Again, this minimizes the visual impact and enables the base 702 and antenna cover 102 (including the components housed therein) to blend in with their surroundings. Additionally or alternatively, decorative sleeves (not shown) may be used to customize the appearance of a base 702. For example, standard bases 702 may be manufactured, and customized sleeves may go over the standard bases in order to give the bases a customized appearance. A decorative sleeve may be fluted, scalloped, or have any other ornamental appearance. A sleeve of a particular texture and color may have the appearance of a rock, tree bark, or any other desired feature.

Aspects hereof provide for anchors used in the installation of bases 702, such as poles 204. An exemplary anchor is constructed of high-density foam, such as foam having a density of approximately 25 pounds per cubic foot. The foam may be pre-formed in a wedge shape. Again, the lightweight nature of such anchor facilitates quick installation with minimal manpower and equipment.

Aspects hereof provide for control cabinets 206 configured to house equipment for processing signals associated with an antenna. An exemplary control cabinet 206 includes a substrate layer 106 and a protective layer 108. The substrate layer 106 is a lightweight material, such as foam, and the protective layer 108 is polyurea. The control cabinet 206 may take any size and shape. As the size of the equipment housed within the control cabinet 206 decreases, the size of the control cabinet may also be reduced.

Various aspects described herein may be commercialized as individual components and/or as a prepackaged kit. For example, an antenna-protection kit may include an antenna cover 102, an equipment-mounting component 304, a base 702, and/or a control cabinet 206. Additionally or alternatively, such components may be provided individually. Various aspects described herein may also be modular. For example, a cover 102 may be configured to attach to a base described herein, but it may also be quickly and easily installed on existing infrastructure, such as an existing pole or building.

This discussion of exemplary advantages is illustrative only and is not intended to be limiting. Based on the disclosure, it will be understood that additional advantages are provided by aspects described herein.

Exemplary aspects hereof will now be described with reference to the figures, in which like elements are depicted with like reference numerals.

Exemplary Protective Enclosure System

Figure 1B:
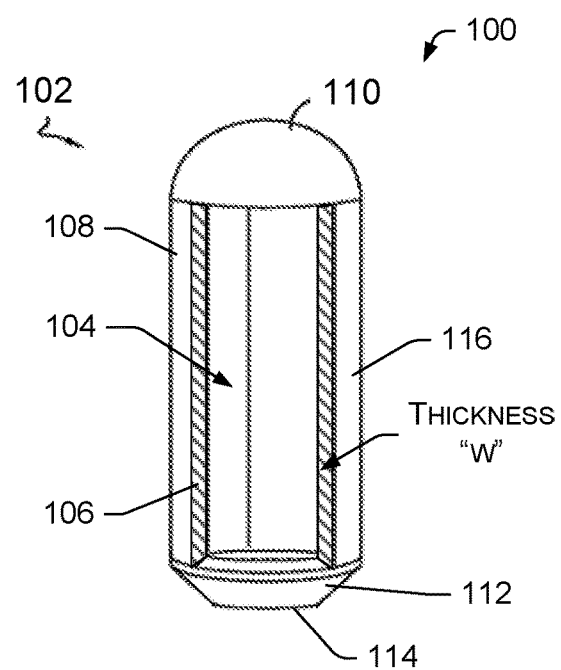
FIG. 1B is a cut-away view of the example protective enclosure of FIG. 1, according to an embodiment.

Referring to FIGS. 1A and 1B, an exemplary protective enclosure system 100 includes a cover 102 that has a protective cavity 104 within an interior of the cover 102. In various embodiments, the cover 102 is comprised of a substrate layer 106 and a protective layer 108, which are discussed in more detail below. The cover 102 includes a closed top portion 110 (which may include one or more openings if needed for a particular application), a bottom portion 112 (which may have at least one opening 114, but may not have any openings in some applications), and a side portion 116. The side portion 116 may be a single component (such as a tube, prism, or cylinder for instance) or it may be comprised of multiple panels 118. For instance, the multiple panels 118 may be coupled together to form the side portion 116. Any or all of the top 110, bottom 112, and side 116 portions may be integral to one another or can be coupled to one another to form the cover 102, which also forms an interior cavity 104 within the cover 102. In other words, the cover 102 is hollow, with the interior cavity 104 configured to fit an item to be protected by the cover 102.

FIG. 1B shows a cut-away drawing of an example cover 102, as part of an example protective enclosure system 100. The cut-away shows an example thickness of the side portion 116, which is the thickness "w" of the substrate layer 106. The protective layer 108 is disposed on the outer surface of the substrate layer 106, and may have a negligible thickness (e.g., less than 0.5 mm). Alternately, the protective layer 108 may have a thickness of more than 0.5 mm, and in some cases may have a thickness of several millimeters. Even a thin protective layer 108 provides resistance to abrasion and adds strength to the substrate layer 106, as well as providing protection from ultra-violet radiation, oxidation, moisture, and other environmental factors.

The top portion 110 and the bottom portion 112 are similarly constructed, with a substrate layer 106 having a predetermined thickness "w" that is covered by a protective layer 108. In some embodiments, the top portion 110 and/or the bottom portion 112 may have different thickness than the side portion 116. Alternately, the top portion 110, the bottom portion 112, and/or the side portion 116 may have a non-uniform thickness, where some regions of the portions are thicker than other regions. A non-uniform thickness may be used to provide additional protection or strength to some regions or portions, for instance at the top 110 or bottom 114 portions, for example.

Figure 2A:
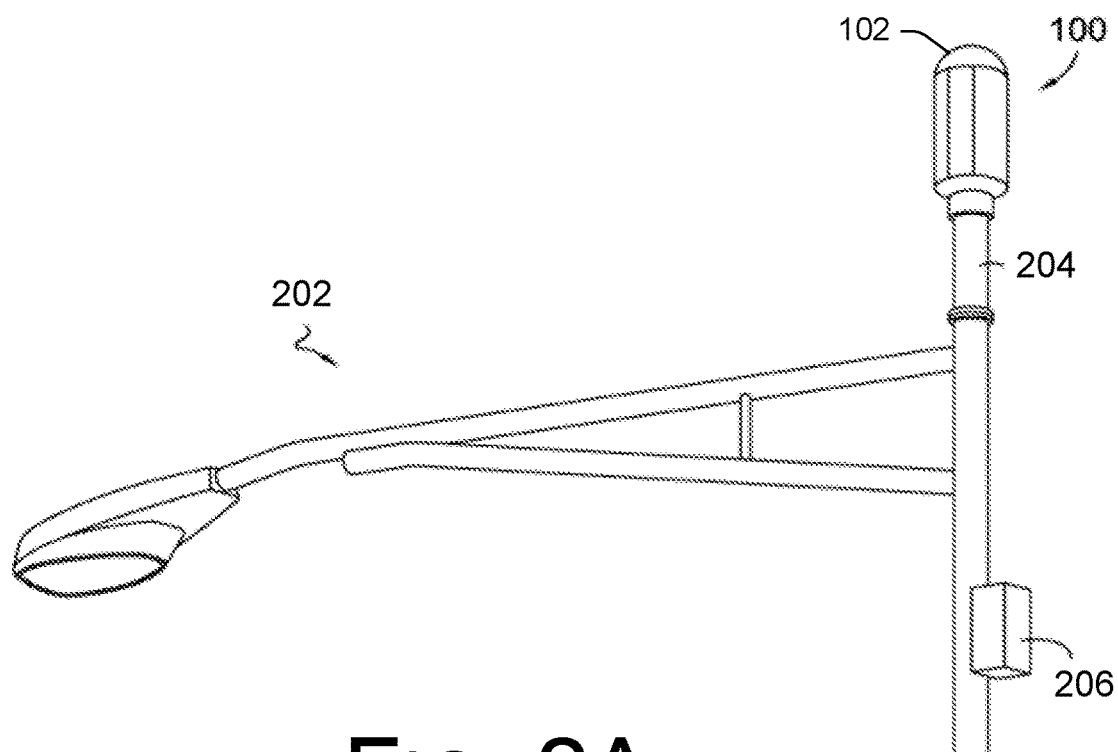
FIG. 2A is a perspective view of an example antenna-mounting system, including an example protective enclosure, installed on a street light, according to an embodiment.

FIG. 2A depicts a perspective view of an exemplary protective enclosure system 100 installed on top of a streetlight 202. The protective enclosure system 100 includes a pole 204, which is coupled to the streetlight 202. The pole 204 may have features similar to those discussed with respect to the base 702 depicted in FIG. 7, or the pole 204 may comprise the base 702 depicted in FIG. 7. A control cabinet 206 can be attached to the streetlight 202 and can house equipment associated with a mobile communications network. For example, the equipment may be used for processing signals associated with an antenna encased within the cover 102. As mentioned above, any or all of the components mentioned (e.g., the cover 102, the pole 204, and the cabinet 206) can be constructed of the lightweight substrate layer 106 covered by the protective layer 108. Because aspects hereof provide for a lightweight protective enclosure system 100, these components can be mounted to the streetlight 202 without compromising its structural integrity.

Figure 2B:
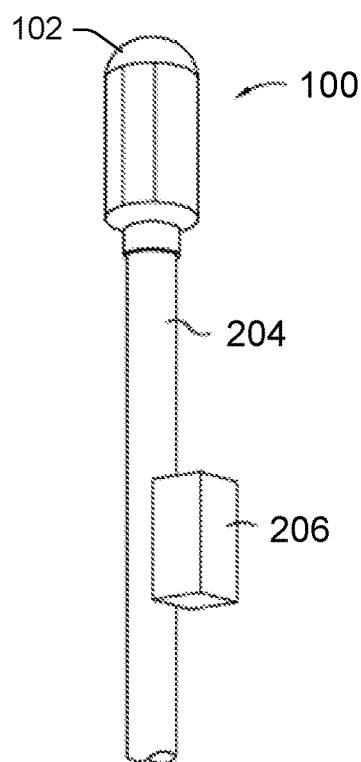
FIG. 2B is a perspective view of an antenna-mounting system, including an example protective enclosure, installed on a pole, according to an embodiment.

FIG. 2B depicts a perspective view of another exemplary protective enclosure system 100 that includes a standalone pole 204. The pole 204 may have features similar to those discussed with respect to the base 702 depicted in FIG. 7 or the pole 204 may comprise the base 702 depicted in FIG. 7. A control cabinet 206 is attached to the pole 204 and can house equipment associated with a mobile communications network, for example.

Figure 3A:
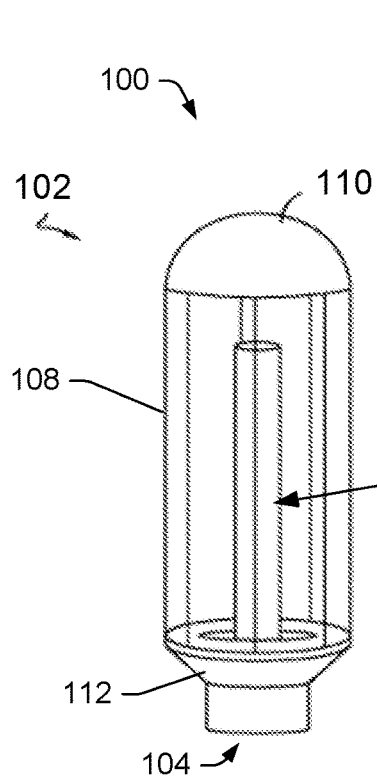
FIG. 3A is a perspective view of an example protective enclosure, shown with transparent panels for showing detail and showing an example antenna within the enclosure, according to an embodiment.
Figure 3B:
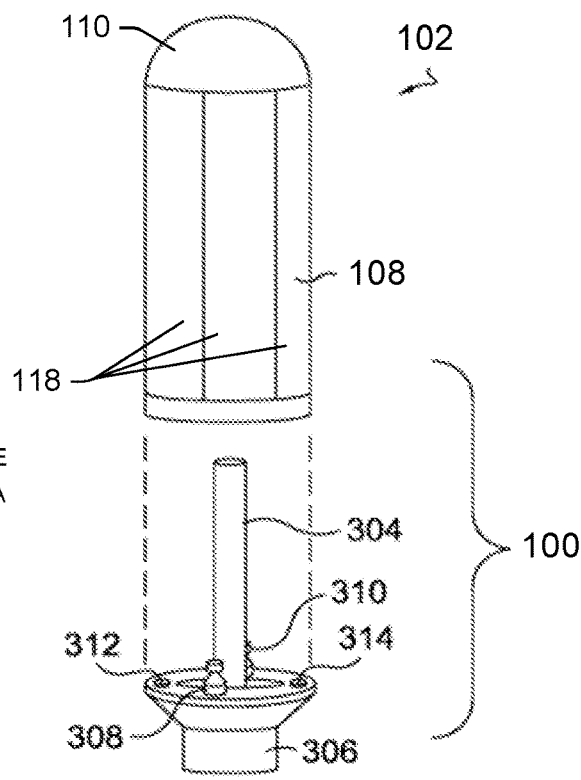
FIG. 3B is a disassembled view of an example protective enclosure, showing an example antenna within the enclosure, according to an embodiment.
Figure 3C:
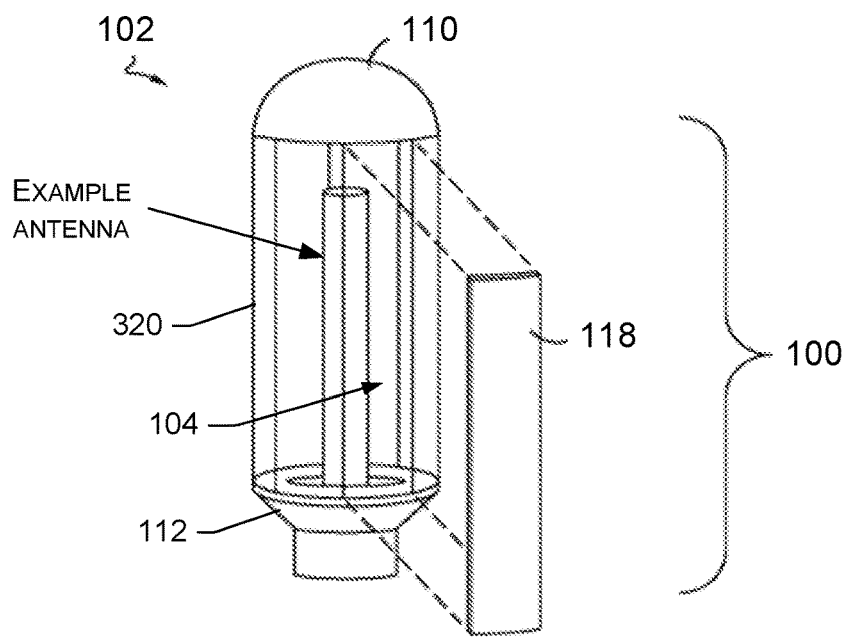
FIG. 3C is a disassembled view of an example protective enclosure, shown with transparent panels for showing detail and showing an example antenna within the enclosure and one panel removed, according to an embodiment.

FIGS. 3A-3C show various views of an exemplary protective enclosure system 100. In FIGS. 3A and 3C, the cover 102 is shown transparent, so that inside detail can be easily seen. In some implementations, the cover 102 may have various degrees of light permeability. An example antenna is shown enclosed within the cover 102 for further illustration. This is not intended to be limiting. In various applications, various types of equipment may be enclosed within the cover 102, and may be mounted to fixtures (such as the equipment-mounting component 304, or another type of fixture) within the cavity 104.

Figure 4:
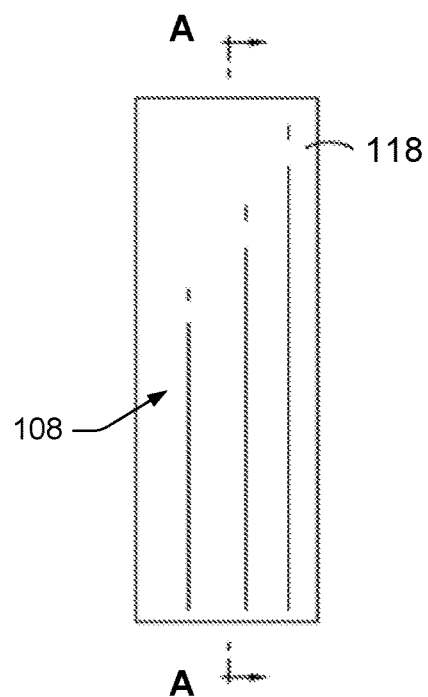
FIG. 4 is a perspective view of an example panel of a protective enclosure, according to an embodiment.
Figure 5:
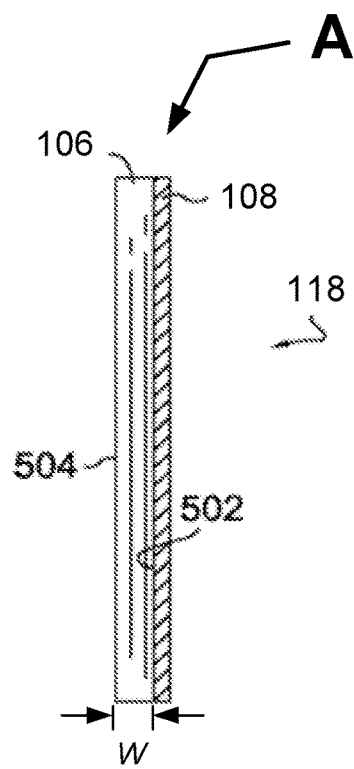
FIG. 5 is a cross-section view of the panel of FIG. 4, according to an embodiment.
Figure 6:
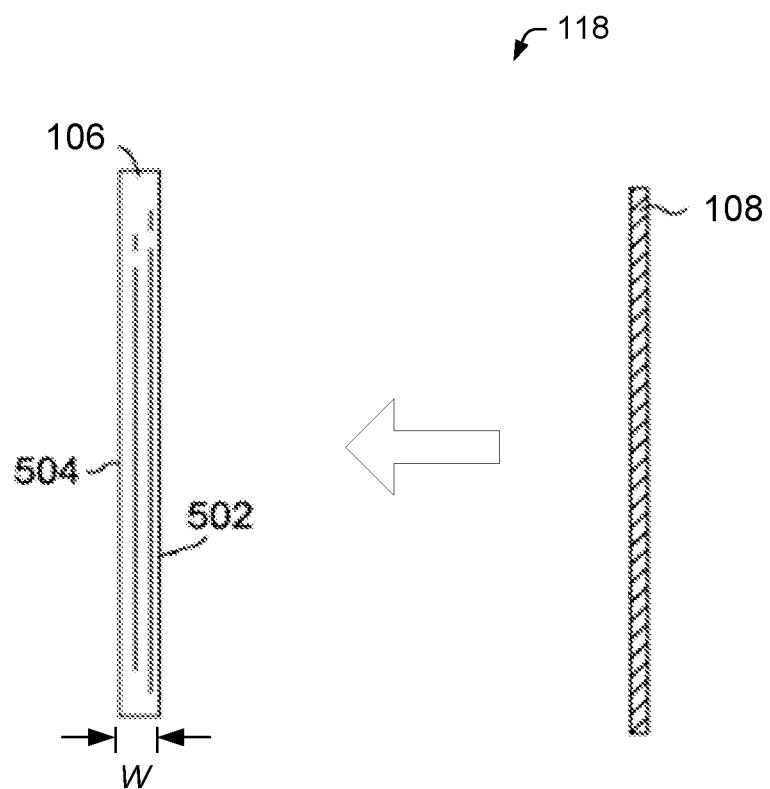
FIG. 6 is an exploded cross-section view of the panel of FIG. 4, showing multiple layers, according to an embodiment.

The cover 102 includes a substrate layer 106 and a protective layer 108, which are illustrated in more detail in FIGS. 4-6. The substrate layer 106 of the cover 102 is a foam, plastic, or other lightweight material. For example, a 2-inch layer of foam (such as polyisocyanurate, for example) having a density of 2-6 pounds per cubic foot may be utilized. Foams of other thicknesses and densities may also be used. Examples of suitable foams include the products sold by The Dragon Group, LLC under the following trademarks: Dragon Jacket F2MD, Dragon Jacket F4MD and Dragon Jacket F6MD. A foam manufactured by Specialty Products, Inc. and sold under the trademark EnveloSeal™, 2.0-30.0 pounds, is also suitable. Foams having a density of 1 to 10 pounds per cubic feet may be used for the cover 102. Closed cell foams having a density from 2 to 10 pounds per cubic feet may also be used.

The substrate layer 106 of the cover 102 includes a first surface 502 (e.g., an outer surface in an in-use configuration), a second surface 504 (e.g., an inner surface in an in-use configuration), and a thickness (w) extending between the first 502 and second 504 surfaces. This is discussed further below with reference to FIGS. 4-6.

The substrate layer 106 of the cover 102 may be a unitary construction and/or it may be comprised of multiple components. For example, a unitary construction may be provided by molding foam into the shape desired for the application (such as the shape of the example cover 102 of FIG. 1A, for example). The protective layer 108 may then be applied, such as by spraying the protective layer 108 to the outer surface 502 of the substrate layer 106. Additionally or alternatively, the substrate layer 106 may include multiple panels 118 that are assembled into the configuration depicted in FIG. 1A. The panel configuration is discussed in more detail with respect to FIGS. 4-6.

The protective layer 108 of the cover 102 is a radio-frequency-transparent polyurea. For example, certain polymers manufactured by Specialty Products, Inc. and sold under the following trademarks are transparent to frequencies up to at least 25 GHz (and over) and are thus suitable for 5G applications, as well as other applications: ElastaFlex Product Series, ElastaFlex™ ArcHIBRITE, ElastaFlex™ CR, ElastaFlex™ HP, and ElastaFlex™ III. Additional examples include products sold by The Dragon Group, LLC under the following trademarks: Dragon Jacket S2, and Dragon Jacket S2 Hi Brite. Any one or combination of these materials may be used for the protective layer 108. Other radio-frequency-transparent materials are also included in the scope hereof. The aforementioned products are available as a sprayable polyurea and may thus be applied to the substrate layer 106 via spraying. The combination of a lightweight substrate 106 and protective layer 108 provides the advantages described above, among others. The protective layer 108 is adhered to the first surface 502. This is further discussed with respect to FIGS. 4-6.

FIG. 3A shows a protective enclosure system 100 in an example installation, housing an example antenna for a mobile communications network. FIG. 3B shows the protective enclosure system 100 with the cover 102 raised and antenna removed, to show example detail within the cover 102. In an implementation, an antenna-mounting system includes an equipment-mounting component 304 and an attachment sleeve 306, which may be integral to the lower portion 112 of the cover 102 or may be coupled to the lower portion 112. The equipment-mounting component 304 can be configured to receive an antenna, for example, and to secure the antenna within the cover 102. Hardware and connection components may be molded into the cover 102 (for instance the lower portion 112 of the cover 102) in some instances. In embodiments, one or both of the equipment-mounting component 304 and an attachment sleeve 306 may be formed from the material of the substrate layer 106, the material of the protective layer 108, or both. For example, one or both of the equipment-mounting component 304 and the attachment sleeve 306 may have a layered structure of the materials and arrangement similar to the cover 102 (e.g., the substrate layer 106 coated with the protective layer 108).

The equipment-mounting component 304, as shown at FIG. 3B, may be positioned adjacent to the cover 102 such that the second surface 504 (e.g., the inner surface in an in-use configuration—see FIG. 5) is between the equipment-mounting component 304 and the protective layer 108.

In an implementation, the cover 102 encases an antenna-receiving cavity 104. The equipment-mounting component 304 is positioned in the antenna-receiving cavity 104. The equipment-mounting component 304 supports an antenna and related components. It is depicted here as a cylindrical tube, but it may take a variety of forms. For example, it may be an H-configuration. It may include a movable member to which the antenna is attached, and the movable member may enable different tilts, pitches, angles, and the like. For example, the movable member may position the antenna at a specified angle. This allows the position of the antenna to be customized to optimize signal reception and/or transmission.

In use, the attachment sleeve 306 is adjacent to the cover 102. The attachment sleeve 306 couples to a base, such as the base 702 of FIG. 7 or the pole 204. The attachment sleeve 306 can include keyways 308 and 310, which correspond to keyway receivers in the cover 102 (not shown), for maintaining the relative position between cover 102 and the attachment sleeve 306. Bolts 312 and 314 (or the like) secure the attachment sleeve 306 to the cover 302. The depicted keyways (308, 310) and bolts (312, 314) are exemplary only. It will be understood that any number of means may be used for attaching the cover 102 to the attachment sleeve 306 and/or maintaining alignment between the two. Such means may include screwing, gluing, adhering, clamping, threading, or any other means.

FIG. 3C shows an example protective enclosure system 100 with one panel 118 of the cover 102 removed. In this example, the cover 102 is not a unitary construction, but is constructed of discrete panels 118 that are coupled together. In an example, the cover 102 includes a frame 320 to which one or more individual portions or panels, such as panel 118, are attached to form a cover 102. The frame 320 may be constructed of any number of materials, including foam, a combination of foam and polyurea, plastic, and the like. Lightweight materials, such as a lightweight foam coated with polyurea, offer the advantage of a lightweight antenna-mounting system, for example. For simplicity, FIG. 3C depicts an exploded view of the frame 320 and a single panel 118, but it will be understood that the protective enclosure system 100 may include a number of panels 118 corresponding to a number of panel locations in the frame 320, such that when all panels 118 are attached to the frame 320, the frame 320 and the panels 118 form a protective cavity 104, as discussed above. The panels 118 may be attached to the frame 320 via any means, including screws, bolts, glue, adhesive, clamps, or any other means. In some embodiments, the top portion 110 and/or the bottom portion 112 may be formed separately from the frame 320, or they may be formed as a unit with the frame 320.

FIGS. 4-6 depict an exemplary panel 118 of a cover 102. In an example, the panels 118 include a substrate layer 106 and a protective layer 108 as discussed above. The protective layer 108 may be applied to the substrate 106 panels 118 before they are assembled on the frame 320. Additionally or alternatively, the protective layer 108 may be applied to the substrate 106 panels 118 after they are assembled on the frame 320.

The substrate layer 106 and protective layer 108 are illustrated in more detail in FIGS. 4-6. FIG. 4 depicts a perspective view of a panel 118 and FIG. 5 depicts a cross-section view of the panel 118. FIG. 6 shows a cross-section view of the substrate layer 106 and the protective layer 108 as separate layers. The substrate layer 106 of the panel 118 includes a first surface 502 (e.g., an outer surface in an in-use configuration), a second surface 504 (e.g., an inner surface in an in-use configuration), and a thickness (w) extending between the first 502 and second 504 surfaces. As shown, the protective layer 108 is coupled to (adheres to) the first surface 502.

In an embodiment, the substrate layer 106 comprises a light-weight foam material that has a predetermined thickness "w" and a predetermined density. The substrate layer 106 is transparent to radio frequencies from 0 GHz to over 25 GHz at the predetermined thickness "w" and the predetermined density. For example, the predetermined thickness "w" may be between 1 and 3 inches thick for a cover 102, and the predetermined density may be between 1 to 10 pounds per cubic foot. The substrate layer 106 can have a different density, as mentioned above, when used for other components of the protective enclosure system 100.

In an alternative embodiment, the panel 118 may be comprised of the protective layer 108 or multiple layers of the protective layer 108, which may be coupled to and supported by the frame 320. In other words, in the alternative embodiment, the substrate layer 106 may be comprised of the protective layer 108 (i.e., the radio-frequency-transparent polyurea), at a predetermined thickness "w," instead of a foam as discussed above. In various examples, the radio-frequency-transparent polyurea may or may not be covered by an additional protective layer 108. The top 110, bottom 112, and/or the frame 320 may be comprised of the radio-frequency-transparent polyurea also or a lightweight foam, such as the material of the substrate layer 106 as discussed above. The top 110, bottom 112, and/or the frame 320 may be covered by the additional protective layer 108 as discussed above.

In another alternative embodiment, the cover 102 is entirely comprised of the protective layer 108 (i.e., the radio-frequency-transparent polyurea) having a predetermined thickness "w" that is transparent to radio frequencies from 0 GHz to over 25 GHz at the predetermined thickness "w." The cover 102 forms a protective cavity 104 and an equipment-mounting component 304 can be positioned within the protective cavity 104. The equipment-mounting component 304 can be configured to mount an item to be protected (e.g., an antenna or the like) such that the item is fully enclosed by the cover 102.

It will be understood that configurations of the cover 102 depicted in the figures are exemplary only. The covers 102 may be any shape or size. For example, a megaphone shape may be desirable for directional antennas. Additionally, as discussed above, the antenna covers 102 may be customized to blend in with the environment in which an antenna is to be installed.

Figure 7:
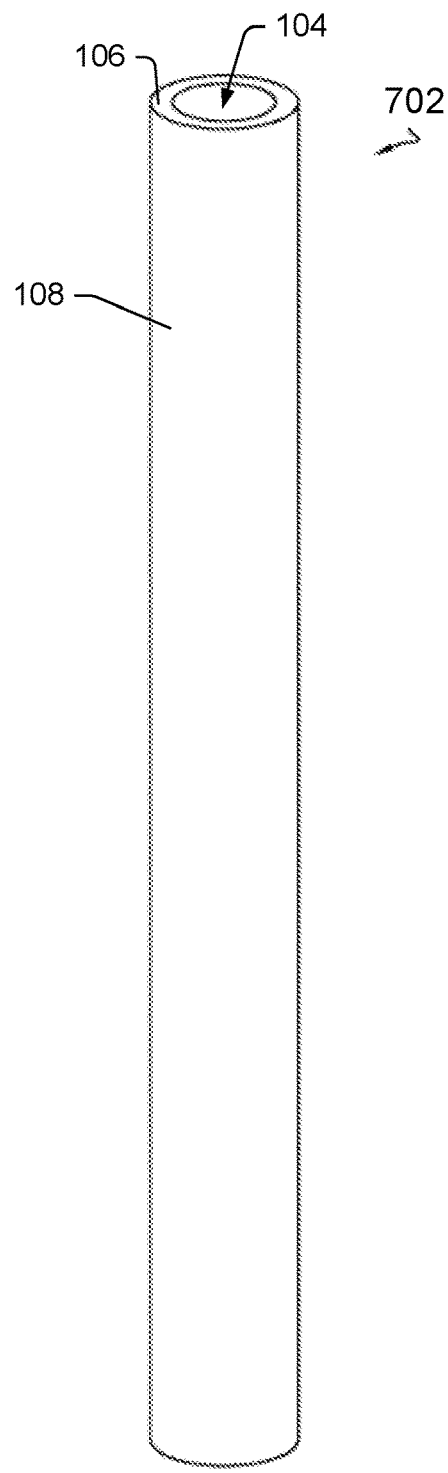
FIG. 7 is a perspective view of an example base for a protective enclosure, according to an embodiment.

Turning now to FIG. 7, an exemplary base 702 is depicted. The exemplary base 702 can take the form of a hollow, elongated pole, but as previously discussed, the base 702 may be any size, shape, and texture. In example aspects, the base 702 is an ultra-high-density foam, such as a foam having a density of at least 54 pounds per square foot. When used in conjunction with the other lightweight antenna-mounting system components described herein, the base 702 can be relatively small, because it is supporting a relatively small load. Hardware and connection components may be molded into the base 702 in some instances.

A decorative sleeve (not shown) may be used to customize the appearance of the base 702. For example, standard bases 702 may be manufactured, and customized sleeves may go over the standard bases 702 in order to give the base 702 a customized appearance. A decorative sleeve may be fluted, scalloped, or have any other ornamental appearance. A decorative sleeve of a particular texture and color may have the appearance of a rock, tree bark, or any other desired feature.

Additional equipment may be attached to the base 702. For example, a control cabinet 206 that houses equipment for processing signals associated with the antenna may be attached to the base 702. An exemplary control cabinet 206 is shown at FIGS. 2A and 2B. A control cabinet 206 may include a substrate layer 106, such as a foam or plastic, and a protective layer 108, such as a polyurea. The foam substrate 106 may be a pour foam, and the polyurea may be a sprayable liquid polyurea when applied, which cures to a solid state.

Various components herein may be provided as an antenna-protection kit. An exemplary kit may include an antenna cover 102 (e.g., as described with respect to FIGS. 1-6), an equipment-mounting component 304 (e.g., as described with respect to FIG. 3B), and a control cabinet 206 (e.g., as described with respect to FIGS. 2A and 2B). Such a kit may also include a base 702, such as the base 702 described with respect to FIG. 7. Any of the components of the kit may be used to retro-fit an existing installation to upgrade the installation or be added to an existing installation. For instance, a cover 102 may be mounted to an existing wood pole or a base 702 may be substituted for an antenna mounting pole when a cover 102 is used, and so forth.

In various embodiments, the protective enclosure system 100 may be added to an existing arrangement (such as existing structures and assemblies, for example). For instance, the existing arrangements may be retrofitted with the protective enclosure system 100 or with protective enclosure system 100 components. In other embodiments, the protective enclosure system 100 may be a part of a new arrangement, enclosure, installation, or the like.

Although aspects are described herein with a focus on antennas, it will be understood that other signal-transmitting devices are included within the scope hereof. For example, the covers 102 described herein may be used in conjunction with any wireless communication component, or even as a cellular phone case.

Aspects of the present disclosure have been described with the intent to be illustrative rather than restrictive. Alternative aspects will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Not all steps listed in the various figures need be carried out in the specific order described.

Representative Process

Figure 8:
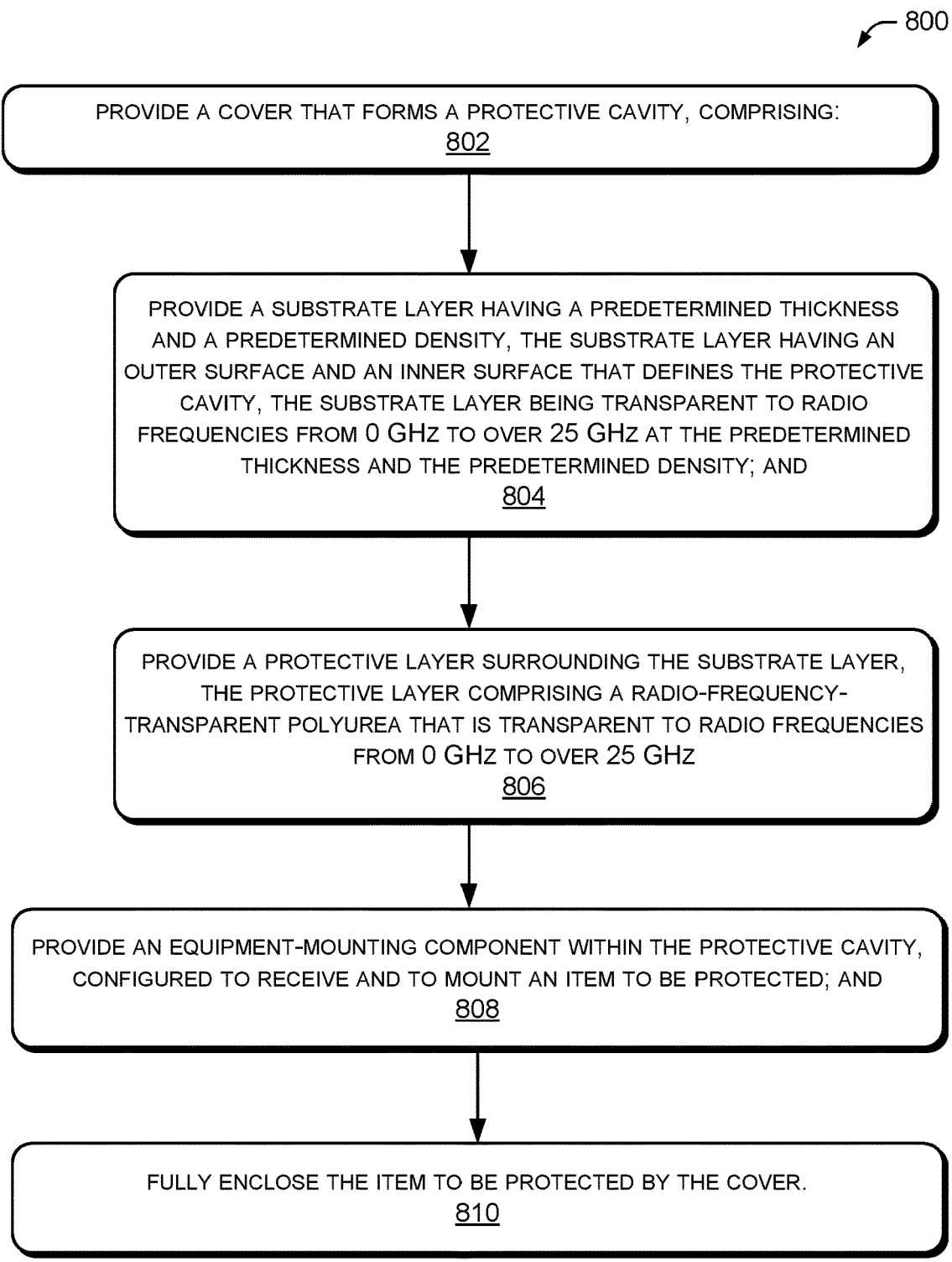
FIG. 8 is a flow diagram illustrating an example process of forming a protective enclosure for a sensitive component, according to an implementation.

FIG. 8 illustrates a representative process 800 for implementing techniques and/or devices relative to providing a protective enclosure system (such as the system 100, for example), according to various embodiments. The system includes a cover (such as cover 102, for example) formed from at least two layers. In an implementation, the process described a method for forming a protective enclosure and mounting system for a mobile communications network antenna. The example process 800 is described with reference to FIGS. 1-7.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein.

At block 802, the process includes providing a cover that forms a protective cavity (such as the cavity 104, for example) for enclosing protective equipment. The cover may include any number of layers, and includes at least two layers as described at blocks 804 and 806. The cover may be formed and configured to protect a mobile communications network antenna.

At block 804, the process includes providing a substrate layer having a predetermined thickness and a predetermined density, the substrate layer (such as the substrate layer 106, for example) has an outer surface (such as outer surface 502, for example) and an inner surface (such as inner surface 504, for example) that defines the protective cavity. The substrate layer is transparent to radio frequencies from 0 GHz to over 25 GHz at the predetermined thickness and the predetermined density.

In an example, the process includes injection molding the substrate layer from a light-weight foam material having a low density. For example, the low density includes a density of between 1 to 10 pounds per cubic foot. In another example, the process includes injection molding multiple panels from the foam material and assembling the multiple panels to form the substrate layer of the cover.

At block 806, the process includes providing a protective layer (such as the protective layer 108, for example) and surrounding the substrate layer with the protective layer. The protective layer comprises a radio-frequency-transparent polyurea that is transparent to radio frequencies from 0 GHz to over 25 GHz.

In an example, the process includes coating the outer surface of the substrate layer with the radio-frequency-transparent polyurea while the radio-frequency-transparent polyurea is in a liquid state, and curing the radio-frequency-transparent polyurea to a solid state onto the outer surface of the substrate layer. The coating process may include applying the protective layer to the outer surface of the substrate or applying the protective layer to the inside of a mold, and depositing the substrate material over the protective layer within the mold. In some cases, the coating process may include spraying the protective layer onto the outer surface of the substrate layer. For example, the process includes adhering the radio-frequency-transparent polyurea to the outer surface of the substrate layer.

At block 808, the process includes providing an equipment-mounting component (such as the component 304, for example) within the protective cavity, configured to receive and to mount an item to be protected. The equipment-mounting component may take any shape or size desirable to mount equipment for a particular application.

At block 810, the process includes fully enclosing the item to be protected by the cover.

In various examples, the process includes providing a sleeve, a base, an equipment cabinet, or various other items as described above to be installed with the cover and used to support the equipment to be protected. In the examples, one or more of the item may be formed from the substrate layer coated with the protective layer. The substrate layer of one or more of the items may have a higher density than the density of the cover substrate, based on the desired support capabilities of the item.

In alternate implementations, other techniques may be included in the process in various combinations, and remain within the scope of the disclosure. Although various implementations and examples are discussed herein, further implementations and examples may be possible by combining the features and elements of individual implementations and examples.

The subject matter of the present disclosure is described with specificity to meet statutory requirements. However, the description itself is not intended to limit the scope of this disclosure. Rather, the claimed or disclosed subject matter might also be embodied in other ways to include different components, steps, or combinations thereof similar to the ones described in this document, in conjunction with other present or future technologies. Terms should not be interpreted as implying any particular order among or between various steps disclosed herein unless and except when the order of individual steps is explicitly described.

For purposes of this disclosure, the word "including" has the same broad meaning as the word "comprising." In addition, words such as "a" and "an," unless otherwise indicated to the contrary, include the plural as well as the singular. Thus, for example, the constraint of "a feature" is satisfied where one or more features are present. Also, the term "or" includes the conjunctive, the disjunctive, and both (a or b thus includes either a or b, as well as a and b).

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing the claims.

What is claimed is:

1. A protective enclosure system comprising:
a cover that forms a protective cavity, the cover comprising:
a substrate layer having a predetermined thickness and a predetermined density, the substrate layer having an outer surface and an inner surface that defines the protective cavity, the substrate layer being transparent to radio frequencies from 0 GHz to over 25 GHz at the predetermined thickness and the predetermined density; and
a protective layer surrounding the substrate layer, the protective layer comprising a radio-frequency-transparent polyurea that is transparent to radio frequencies from 0 GHz to over 25 GHz; and
an equipment-mounting component positioned within the protective cavity, configured to mount an item to be protected such that the item is fully enclosed by the cover.

2. The protective enclosure system of claim 1, wherein the substrate layer comprises a light-weight foam material having a density of between 1 to 10 pounds per cubic foot.

3. The protective enclosure system of claim 1, wherein the radio-frequency-transparent polyurea comprises a polyurea material capable of being sprayed while in a liquid state and curing to a solid state.

4. The protective enclosure system of claim 1, wherein the protective layer adheres to the outer surface of the substrate layer.

5. The protective enclosure system of claim 1, wherein the predetermined thickness is defined by a distance between the outer surface and the inner surface of the substrate layer.

6. The protective enclosure system of claim 5, wherein the predetermined thickness is non-uniform over the substrate layer.

7. The protective enclosure system of claim 1, wherein the cover and the protective cavity are shaped and configured to enclose and to secure a 5G mobile network communications antenna within the protective cavity.

8. A protective enclosure system for mobile communications network equipment, comprising:
a cover that forms a protective cavity for enclosing an antenna of the mobile communications network, the cover comprising:
a substrate layer having a predetermined thickness and a density of between 1 to 10 pounds per cubic foot, the substrate layer having an outer surface and an inner surface that defines the protective cavity, the substrate layer being transparent to radio frequencies from 0 GHz to over 25 GHz at the predetermined thickness and the density; and
a protective layer surrounding the outer surface of the substrate layer, the protective layer comprising a radio-frequency-transparent polyurea that is transparent to radio frequencies from 0 GHz to over 25 GHz; and
an antenna-mounting component positioned within the protective cavity and integrated with the cover, the antenna-mounting component configured to attach an antenna of the mobile communications network to the protective enclosure system.

9. The protective enclosure system of claim 1, further comprising an attachment sleeve coupled to the cover.

10. The protective enclosure system of claim 9, further comprising a base coupled to the attachment sleeve, the base comprising an ultra-high-density foam having a density of at least 50 pounds per cubic foot.

11. The protective enclosure system of claim 10, wherein the base comprises a hollow, elongated pole.

12. The protective enclosure system of claim 10, further comprising a decorative sleeve covering the base, the decorative sleeve having a customized appearance and texture.

13. The protective enclosure system of claim 10, further comprising a control cabinet coupled to the base, the control cabinet configured to house equipment associated with the mobile communications network.

14. The protective enclosure system of claim 13, wherein the control cabinet comprises at least two distinct layers, including a foam layer and a sprayable polyurea layer.

15. The protective enclosure system of claim 8, wherein the antenna-mounting component comprises a movable member configured to position an antenna coupled to the antenna-mounting component at a specified angle.

16. A method, comprising:
providing a cover that forms a protective cavity, comprising:
providing a substrate layer having a predetermined thickness and a predetermined density, the substrate layer having an outer surface and an inner surface that defines the protective cavity, the substrate layer being transparent to radio frequencies from 0 GHz to over 25 GHz at the predetermined thickness and the predetermined density; and
providing a protective layer surrounding the substrate layer, the protective layer comprising a radio-frequency-transparent polyurea that is transparent to radio frequencies from 0 GHz to over 25 GHz;
providing an equipment-mounting component within the protective cavity, configured to receive and to mount an item to be protected; and
fully enclosing the item to be protected by the cover.

17. The method of claim 16, further comprising injection molding the substrate layer from a light-weight foam material having a density of between 1 to 10 pounds per cubic foot.

18. The method of claim 17, further comprising injection molding multiple panels and assembling the multiple panels to form the substrate layer.

19. The method of claim 16, further comprising:
coating the outer surface of the substrate layer with the radio-frequency-transparent polyurea while the radio-frequency-transparent polyurea is in a liquid state; and
curing the radio-frequency-transparent polyurea to a solid state onto the outer surface of the substrate layer.

20. The method of claim 16, further comprising adhering the radio-frequency-transparent polyurea to the outer surface of the substrate layer.

21. A protective enclosure system comprising:
a cover that forms a protective cavity, at least a portion of the cover comprising a protective layer comprising a radio-frequency-transparent polyurea having a predetermined thickness that is transparent to radio frequencies from 0 GHz to over 25 GHz at the predetermined thickness; and
an equipment-mounting component positioned within the protective cavity, configured to mount an item to be protected such that the item is fully enclosed by the cover.

22. The protective enclosure system of claim 21, further comprising a frame, wherein the protective layer is coupled to and supported by the frame.

* * * * *